United States Patent
Wu

(10) Patent No.: US 8,659,357 B1
(45) Date of Patent: Feb. 25, 2014

(54) CONDITIONALLY-STABLE OPERATIONAL AMPLIFIER WITH TUNABLE WIDEBAND BUFFERS

(75) Inventor: Honglei Wu, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 9 days.

(21) Appl. No.: 13/564,197

(22) Filed: Aug. 1, 2012

(51) Int. Cl.
*H03G 3/20* (2006.01)

(52) U.S. Cl.
USPC ............ 330/129; 330/302; 330/107; 330/310

(58) Field of Classification Search
USPC .................................. 330/129, 302, 107, 310
See application file for complete search history.

(56) References Cited

U.S. PATENT DOCUMENTS

| | | | |
|---|---|---|---|
| 4,719,430 A * | 1/1988 | Cole | 330/265 |
| 4,937,535 A * | 6/1990 | Underwood et al. | 330/284 |
| 6,353,360 B1 * | 3/2002 | Hau et al. | 330/149 |
| 7,218,082 B2 | 5/2007 | Walter et al. | |
| 7,653,158 B2 | 1/2010 | Rawlins et al. | |
| 7,705,677 B2 * | 4/2010 | Forbes et al. | 330/253 |
| 7,956,685 B2 * | 6/2011 | Johansson | 330/252 |
| 8,064,540 B2 | 11/2011 | Zhou et al. | |
| 8,319,554 B1 * | 11/2012 | Das | 330/258 |
| 8,482,351 B2 * | 7/2013 | Hou | 330/255 |

FOREIGN PATENT DOCUMENTS

WO     02/21682 A1     3/2002

* cited by examiner

*Primary Examiner* — Patricia Nguyen
(74) *Attorney, Agent, or Firm* — Morris & Kamlay LLP

(57) ABSTRACT

A method for processing signals may include, in a conditionally-stable operational amplifier, shifting the gain curve of the conditionally-stable operational amplifier to a desired position, by buffering at least one output signal from at least one transconductance module within the conditionally-stable operational amplifier using a buffer. The desired position of the gain curve may be associated with a desired feedback factor. The shifting of the gain may take place without shifting a corresponding phase. The tuning of the buffer may be based on the desired position of the gain curve which is derived from feedback factor value(s) specified by an application. A phase corresponding to the desired position of the gain curve at 0 dB frequency may be greater than a threshold phase. The buffering may be tuned using at least one tunable wideband buffer so that the corresponding phase at 0 dB frequency remains higher than the threshold phase.

20 Claims, 7 Drawing Sheets

CONDITIONALLY-STABLE OPERATIONAL AMPLIFIER WITH TUNABLE WIDEBAND BUFFERS

TECHNICAL FIELD

Aspects of the present application relate generally to the field of signal amplification. More specifically, certain implementations of the present disclosure relate to a conditionally-stable operational amplifier with tunable wideband buffers.

BACKGROUND

A conditionally-stable operational amplifier is commonly used in applications where a large gain is required from the operational amplifier at relatively high frequencies. Operational amplifiers are usually used in a feedback configuration with a certain feedback factor, which is determined by the application. Many applications also require that the operational amplifier work with a range of feedback factor values instead of a single fixed feedback factor value. However, in a conventional conditionally stable operational amplifier, if the feedback factor is moved too high or too low, the amplifier will not be stable because the phase value at the frequency where the gain curve reaches 0 dB frequency will be below the acceptable threshold. As a result, it is essential for the operational amplifier to operate within an acceptable range of feedback factors (thus the term "a conditionally-stable" operational amplifier). The limitation on the acceptable range of variation of the feedback factor presents a difficulty in instances when the conditionally-stable operational amplifier needs to operate within a large range of feedback factor values.

Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A method and/or system is provided for conditionally-stable operational amplifier with tunable wideband buffers, substantially as shown in and/or described in connection with at least one of the figures, as set forth more completely in the claims.

In accordance with an embodiment of the disclosure, a method for processing signals may include, in a conditionally-stable operational amplifier, shifting a gain curve of the conditionally-stable operational amplifier to a desired position, by buffering at least one output signal from at least one transconductance module within the conditionally-stable operational amplifier using a buffer. The desired position of the gain curve may be associated with a desired feedback factor. The shifting of the gain curve may take place without shifting a corresponding phase curve. The buffer may be tuned for the buffering based on the desired position of the gain curve associated with the desired feedback factor.

A phase at 0 dB frequency corresponding to the desired gain position of the gain curve, may be greater than a threshold phase. The buffer may be tuned using at least one tunable wideband buffer so that the corresponding phase at 0 dB frequency remains higher than the threshold phase. The threshold phase may be −180°. The buffer may be tuned so that the gain curve of the conditionally-stable operational amplifier corresponds to an optimal phase value at 0 dB frequency. The desired position of the gain curve for the conditionally-stable operational amplifier may be determined based on the desired feedback factor. At least one buffer adjustment value corresponding to the desired feedback factor may be selected from a look-up table, if a phase corresponding to the desired position of the gain curve at 0 dB frequency is smaller than −180°. The buffer may be tuned using the at least one buffer adjustment value so that the phase corresponding to the desired position of the gain curve at 0 dB frequency is greater than −180°.

In accordance with another embodiment of the disclosure, a system for processing signals may include one or more circuits comprising in a conditionally-stable operational amplifier, the one or more circuits being operable to shift a gain curve of the conditionally-stable operational amplifier to a desired position, by buffering at least one output signal from at least one transconductance module within the conditionally-stable operational amplifier using a buffer. The desired position of the gain curve may be associated with a desired feedback factor. The shifting of the gain curve may take place without shifting a corresponding phase curve. The buffer may be tuned for the buffering based on the desired position of the gain curve associated with the desired feedback factor.

A phase at 0 dB frequency corresponding to the desired position of the gain curve may be greater than a threshold phase. The buffer may be tuned using at least one tunable wideband buffer so that the corresponding phase at 0 dB frequency remains higher than the threshold phase. The threshold phase may be −180°. The buffer may be tuned so that the gain curve of the conditionally-stable operational amplifier may correspond to an optimal phase value at 0 dB frequency. The desired position of the gain curve for the conditionally-stable operational amplifier may be determined based on the desired feedback factor. At least one buffer adjustment value corresponding to the desired feedback factor may be selected from a look-up table, if a phase corresponding to the desired position of the gain curve at 0 dB frequency is smaller than −180°. The buffering may be tuned using the at least one buffer adjustment value so that the phase corresponding to the desired position of the gain curve at 0 dB frequency is greater than −180°.

In accordance with yet another embodiment of the disclosure, a system for processing signals may include a conditionally-stable operational amplifier including at least one transconductance module coupled to at least one tunable wideband buffer. The conditionally-stable operational amplifier may be operable to shift a gain curve of the conditionally-stable operational amplifier to a desired position, by buffering at least one output signal from the at least one transconductance module within the conditionally-stable operational amplifier using the at least one tunable wideband buffer. The desired position of the gain curve may be associated with a desired feedback factor. The shifting of the gain curve may take place without shifting a corresponding phase curve. The at least one tunable wideband buffer may be tuned for the buffering based on the desired position of the gain curve associated with the desired feedback factor.

The conditionally-stable operational amplifier may be operable to select, from a look-up table, at least one buffer adjustment value corresponding to the desired feedback factor, if a phase corresponding to the desired position of the gain curve at 0 dB frequency is smaller than −180°. The conditionally-stable operational amplifier may be operable to tune the at least one tunable wideband buffer using the at least one buffer adjustment value, so that the phase corresponding to the desired position of the gain curve at 0 dB frequency is greater than −180°. The conditionally-stable operational amplifier may be operable to tune the at least one tunable wideband buffer so that the gain curve of the conditionally-stable operational amplifier corresponds to an optimal phase value at 0 dB frequency.

These and other advantages, aspects and features of the present disclosure, as well as details of illustrated implementation(s) thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "e.g.," introduces a list of one or more non-limiting examples, instances, or illustrations.

The present disclosure relates to a method and system for conditionally-stable operational amplifier with tunable wideband buffers. In various implementations, one or more tunable wide-band buffers may be added into a conditionally-stable operational amplifier, allowing the amplifier to shift its gain curve up and down without shifting the corresponding phase curve. In this way, the conditionally-stable operational amplifier may be tuned to be stable with a wide range of feedback-factor values.

For example, a method for processing signals may include, in a conditionally-stable operational amplifier, shifting the gain curve of the conditionally-stable operational amplifier to a desired position, by buffering at least one output signal from at least one transconductance module within the conditionally-stable operational amplifier. The shifting of the gain may take place without shifting phase. The tuning of the buffer(s) may be based on the feedback-factor that the operational amplifier needs to work with. A phase value at 0 dB frequency corresponding to the desired gain curve may be greater than a threshold phase. The buffering may be tuned using at least one tunable wideband buffer so that the corresponding phase at 0 dB frequency remains higher than the threshold phase. The threshold phase may be −180° or higher depending on the stability safety margin required for any given application.

The feedback factor may be determined by the applications, and the desired gain curve may then be calculated based on the determined feedback factor. At least one buffer adjustment value corresponding to the determined feedback factor may be selected from a look-up table, if a phase corresponding to the desired gain curve at 0 dB frequency is smaller than −180°. The buffering may be tuned using the at least one buffer adjustment value so that the phase corresponding to the desired gain curve at 0 dB frequency is greater than −180°.

Figure 1:
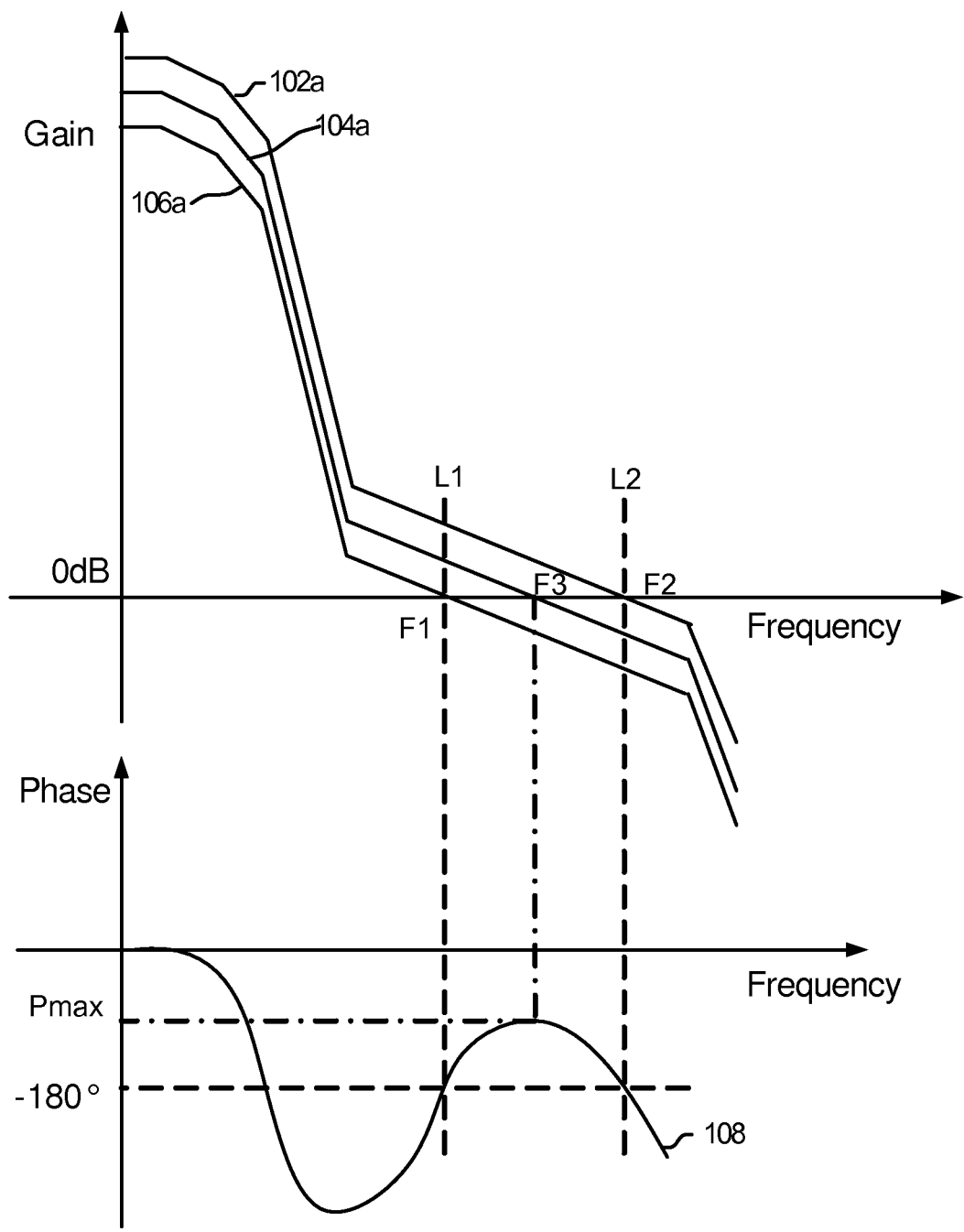
FIG. 1 is a graph showing the gain and phase curves of a conditionally-stable operational amplifier working in stable conditions under different feedback factors.

FIG. 1 is a graph showing the loop gain curve and loop phase curve of a conditionally-stable operational amplifier working in stable conditions in a feedback loop with different feedback factors. Referring to FIG. 1, the gain curves 102a, 104a, and 106a represent three different gains of the operational amplifier, with each gain value having a corresponding feedback factor associated with it. For all gain curves 102a-106a with corresponding feedback factors, the phase curve 108 remains the same. This is due to the fact that changing the feedback factor of the feedback loop only changes the loop gain curve of the feedback loop and does not change the loop phase curve of the feedback loop.

Even though the operational amplifier phase curve 108 remains the same for different feedback factors, the gain curve will shift based on the feedback factor. Additionally, in order for the conditionally-stable operational amplifier to operate in a stable condition, it is essential that the phase value at the frequency where the gain curve reaches 0 dB is higher than −180 degrees.

As seen in FIG. 1, the frequency region where the phase is greater than −180 degrees is bound by axes L1 and L2. In this regard, gain curve 106a, which intersects the 0 dB frequency axis at point F1, represents the minimum allowed gain (and therefore the minimum allowed feedback factor) for assuring a stable operation of the amplifier. Similarly, gain curve 102a, which intersects the 0 dB frequency axis at point F2, represents the maximum allowed gain (and therefore the maximum allowed feedback factor) for assuring a stable operation of the amplifier.

For both feedback factors associated with gain curves 102a and 106a, the corresponding phase value is −180 degrees (the minimum allowed for a stable operation). Gain curve 104a intersects the 0 dB frequency axis at point F3, which is a mid-point between F1 and F2. Therefore, the feedback factor associated with gain curve 104a is optimal since the corresponding phase value (Pmax) is the maximum phase value between axes L1 and L2.

As the feedback factor for the conditionally-stable operational amplifier is moved higher than the feedback factor for gain curve 102a, or lower than the feedback factor for gain curve 106a, the amplifier will not be stable because the phase value at the frequencies where the gain curves reach 0 dB will be below −180 degrees (phase values will be to the right of L2 or to the left of L1). As a result, the conditionally-stable operational amplifier may operate in a stable condition for feedback factors represented with gain curves that intersect the 0 dB frequency axis between L1 and L2.

However, in accordance with an embodiment of the disclosure, the conditionally-stable operational amplifier characterized by the gain and phase curves in FIG. 1, may expand the range of feedback factors and still operate in a stable condition by inserting one or more tunable wideband buffers in its signal processing chain. More specifically, one or more tunable wide-band buffers may be used within the conditionally-stable operational amplifier, allowing for shift in the gain curve without any shift in the phase curve. In this way, the conditionally-stable operational amplifier may be tuned to work with a wide-range of feedback factors.

Figure 2:
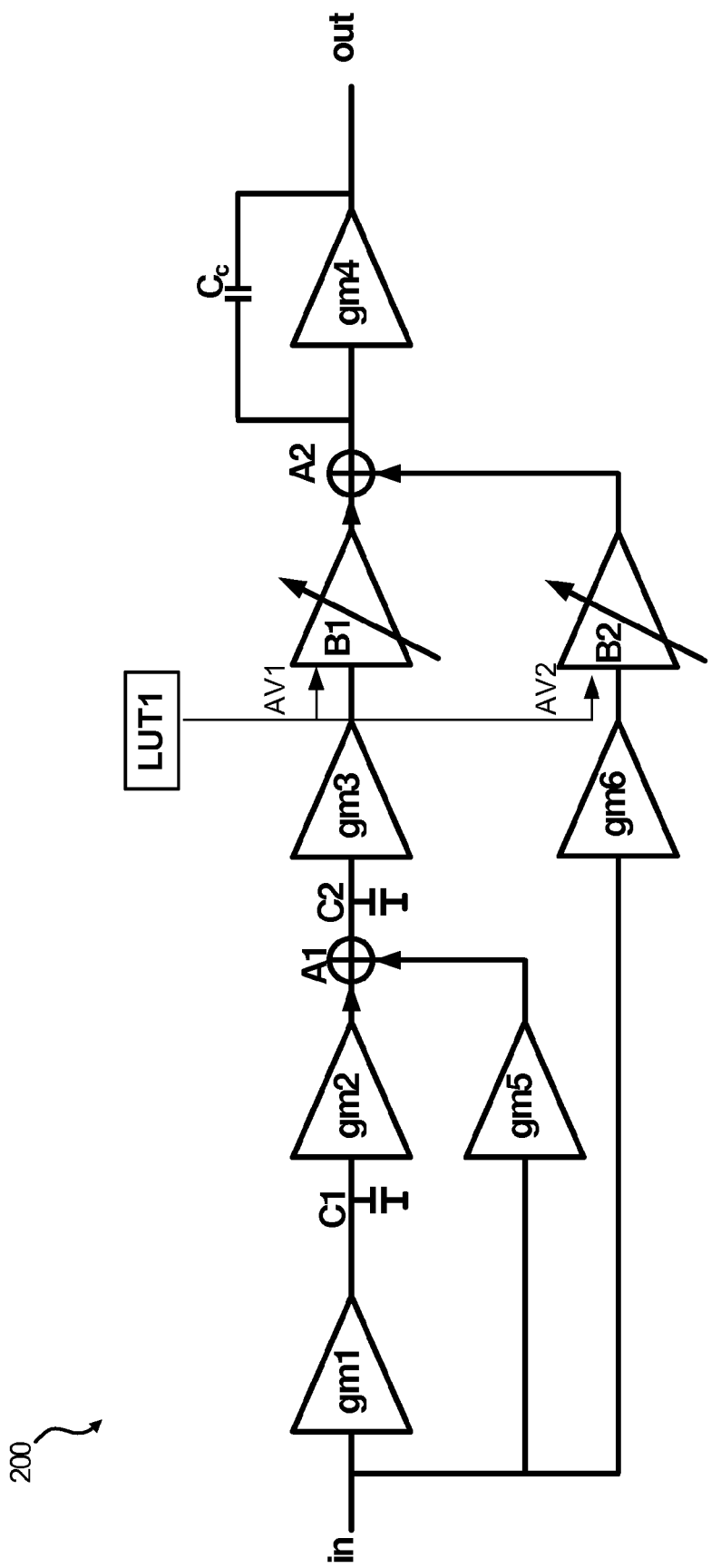
FIG. 2 is a schematic block diagram of an example conditionally-stable operational amplifier with tunable wideband buffers, in accordance with an embodiment of the disclosure.

FIG. 2 is a schematic block diagram of an example conditionally-stable operational amplifier with tunable wideband buffers, in accordance with an embodiment of the disclosure. Referring to FIG. 2, the conditionally-stable operational amplifier 200 may comprise transconductance modules gm1-gm6, and capacitors C1, C2, and Cc. The conditionally-stable operational amplifier 200 may also comprise adders A1-A2, and tunable wideband buffers B1-B2.

The transconductance modules gm1-gm6 may comprise suitable circuitry, logic and/or code and may be operable to convert voltage into current. In an example within the conditionally-stable operational amplifier 200, an input signal (in) may be communicated to transconductance modules gm1, gm5, and gm6. The output of transconductance module gm1 may be communicated to capacitor C1 and then to transconductance module gm2. The outputs of transconductance modules gm2 and gm5 may be added by adder A1, and then the added signal may be communicated to capacitor C2 and transconductance module gm3.

In accordance with an embodiment of this disclosure, the outputs of transconductance modules gm3 and gm6 may be buffered by the tunable wideband buffers B1 and B2, respectively. The output of the tunable wideband buffers B1 and B2 may be added by adder A2 and then communicated to transconductance module gm4, which is coupled in series with capacitor Cc. The output of transconductance module gm4 may be communicated as the final output signal (out).

During operation, the wideband buffers B1 and B2 may be tuned and then used to buffer one or more signals so that gain of the conditionally-stable operational amplifier may be shifted, but without shifting the corresponding phase. More specifically, the conditionally-stable operational amplifier 200 may also comprise a look-up table (LUT1), which may be used to provide adjustment values (AV1 and AV2) to the tunable wideband buffers B1 and B2, respectively. The adjustment values AV1 and AV2 may be used by the wideband buffers B1 and B2 for tuning.

If a desired feedback factor is initially known, then the corresponding desired gain curve may be determined based on the desired feedback factor. The gain and the feedback factor combination may be determined by using the LUT1, for example.

Knowing the desired gain curve and the desired feedback factor, a phase may be determined corresponding to the desired gain curve at 0 dB frequency. If the phase is greater than −180 degrees, then the conditionally-stable operational amplifier is operating under stable conditions and no buffer adjustment is needed.

However, if the determined phase is smaller than −180 degrees, then it may be concluded that the conditionally-stable operational amplifier is operating under unstable conditions. The look-up table LUT1 may then be used to provide adjustment values AV1 and AV2 based on the desired gain curve, desired feedback factor and/or the determined phase. More specifically, the adjustment values AV1 and AV2 may be used to tune the buffers B1 and B2 so that when the desired gain curve and the desired feedback factor are used, the buffering will shift the gain of the amplifier up or down so that the phase corresponding to the desired gain curve at 0 dB frequency is greater than −180 degrees.

Figure 3:
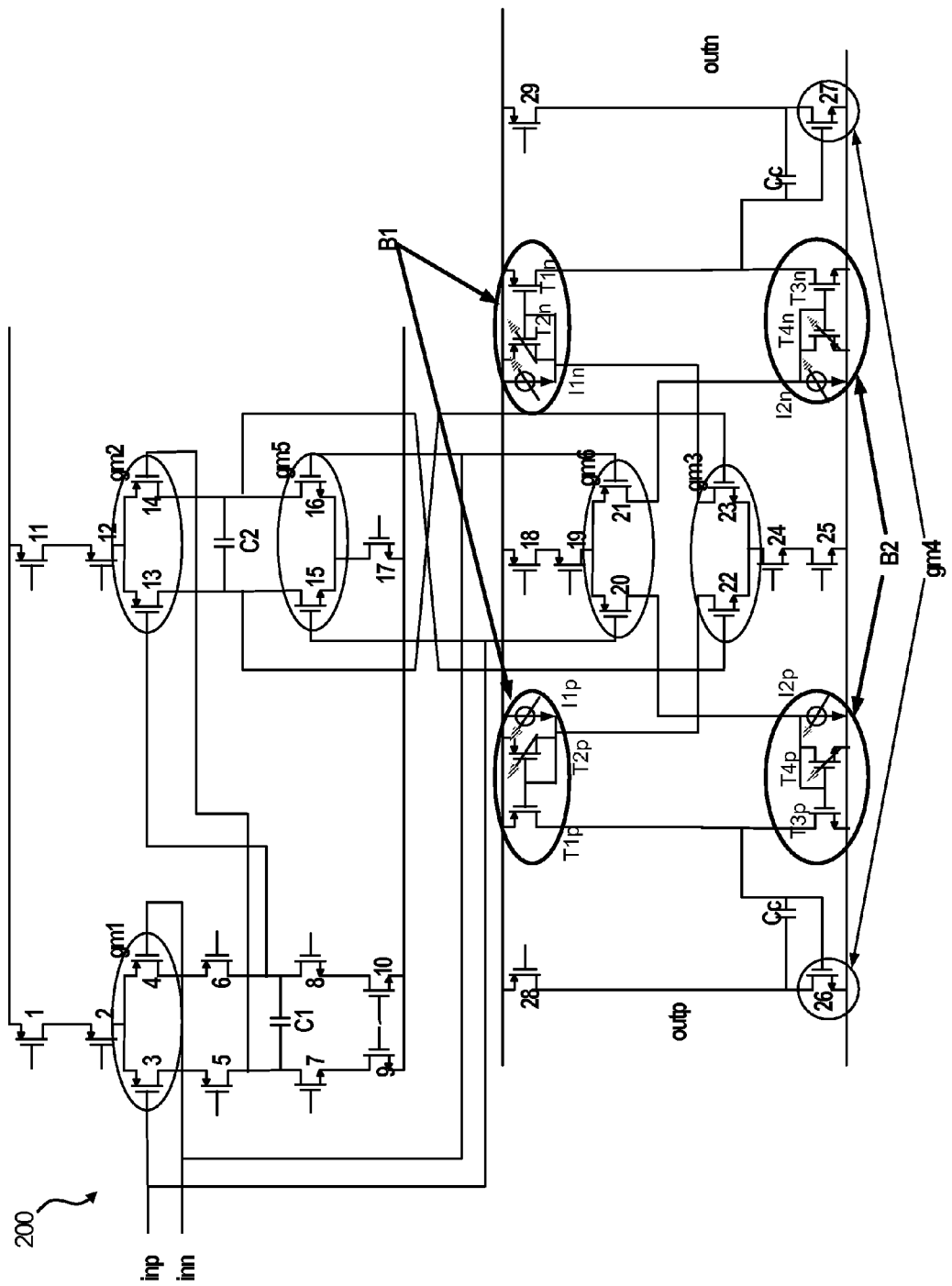
FIG. 3 is a more detailed schematic block diagram of the conditionally-stable operational amplifier with tunable wideband buffers of FIG. 2, in accordance with an embodiment of the disclosure.

FIG. 3 is a more detailed schematic block diagram of the conditionally-stable operational amplifier with tunable wideband buffers of FIG. 2, in accordance with an embodiment of the disclosure. Referring to FIG. 3, the conditionally-stable operational amplifier 200 may comprise transistors 1-29, and capacitors C1, C2, and Cc. The conditionally-stable operational amplifier 200 may also comprise tunable wideband buffers B1-B2.

Transistors 3-4, 13-14, 22-23, 26-27, 15-16, and 20-21 may form transconductance modules gm1, gm2, gm3, gm4, gm5, and gm6, respectively.

Transistor 1 may be used to provide bias current to transconductance module gm1. Transistor 2 is a cascode transistor, which may be used to improve the output impedance of transistor 1. Transistors 5 and 6 are cascode transistors, which may be used to improve the output impedance of transconductance module gm1. Transistors 7 and 8 are also cascode transistors, which may be used to improve the output impedance of transistors 9 and 10.

Transistors 9 and 10 may be used as the load devices of transconductance module gm1. Transistors 11, 17, and 18 may be used provide bias current to transconductance modules gm2, gm5, and gm6, respectively. Transistors 12, 19, and 24 are cascode transistors, which may be used to improve the output impedance of transistors 11, 18, and 25, respectively. Transistors 25, 28, and 29 may be used to provide bias current for transconductance module gm3, transistor 26, and transistor 27, respectively.

Figure 4A:
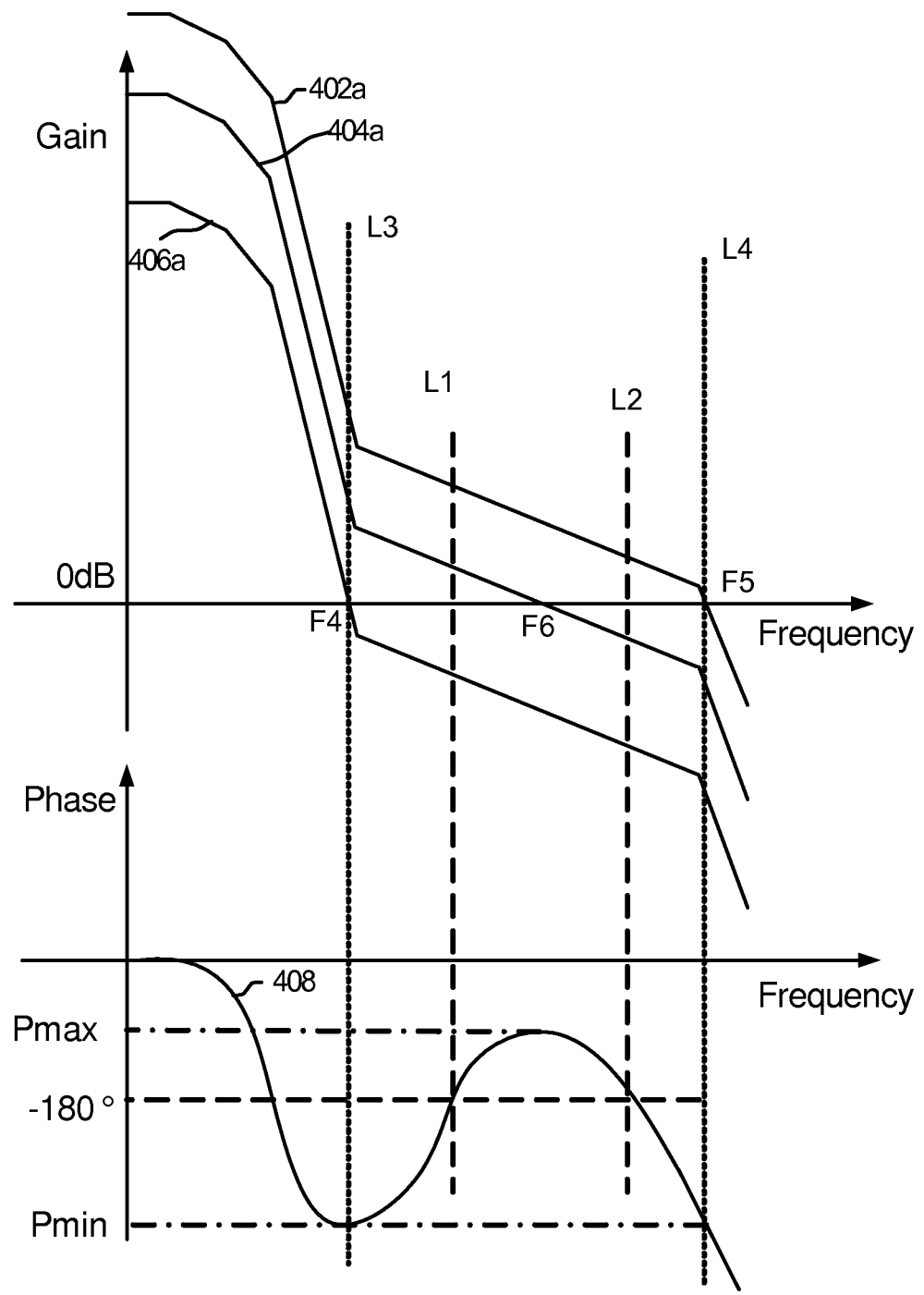
FIG. 4A is a graph showing the gain and phase curves of a conditionally-stable operational amplifier working in unstable conditions under very high and very low feedback factors.

FIG. 4A is a graph showing the gain and phase curves of a conditionally-stable operational amplifier working in unstable conditions under very high and very low feedback factors. Referring to FIGS. 1 and 4A, the gain curves 402a, 404a, and 406a represent three different gains of the same operational amplifier as discussed above in reference to FIG. 1, but for gain curves 402a and 406a the amplifier is now working under unstable conditions, without the use of any tunable wideband buffers.

More specifically, each gain curve 402a-406a has a corresponding feedback factor associated with it, with the phase curve 408 remaining the same. As explained in reference to FIG. 1, the frequency region associated with stable operation of the amplifier is where the phase at 0 dB frequency is greater than −180 degrees (i.e., the region bound by axes L1 and L2).

Gain curves 402a and 406a intersect the 0 dB frequency axis at points F5 and F4, respectively. For the very high feedback factor associated with gain curve 402a, the corresponding phase value is at Pmin, which is below −180 degrees (the minimum allowed for a stable operation). For the very low feedback factor associated with gain curve 406a, the corresponding phase value is also at Pmin. Gain curve 404a intersects the 0 dB frequency axis at point F6, which is a mid-point between F4 and F5. Therefore, the feedback factor associated with gain curve 404a is optimal since the corresponding phase value (Pmax) is the maximum phase value between axes L1 and L2. In this regard, if the conditionally-stable operational amplifier uses either the very high feedback factor (gain curve 402a) or the very low feedback factor (gain curve 406a), the operation of the amplifier will be unstable since the corresponding phases for these gain curves are lower than −180 degrees.

Since gain curve 404a intersects the 0 dB frequency axis at point F6 (a mid-point between F4 and F5), the feedback factor associated with gain curve 404a is optimal since the corresponding phase value (Pmax) is the maximum phase value between axes L1 and L2. Curve 404a represents a case of stable operation.

However, in accordance with an embodiment of the disclosure, the conditionally-stable operational amplifier characterized by the gain and phase curves in FIG. 4A, may expand the range of feedback factors and still operate in a stable environment even under gain curves 402a and 406a by using one or more tunable wideband buffers in its signal processing chain. More specifically, one or more tunable wide-band buffers may be used within the conditionally-stable operational amplifier, allowing for shift in the gain curve (e.g., shifting gain curves 402a and 406a) without any shift in the phase curve 408. In this way, the conditionally-stable operational amplifier may be tuned to work with a wide-range of feedback factors.

Figure 4B:
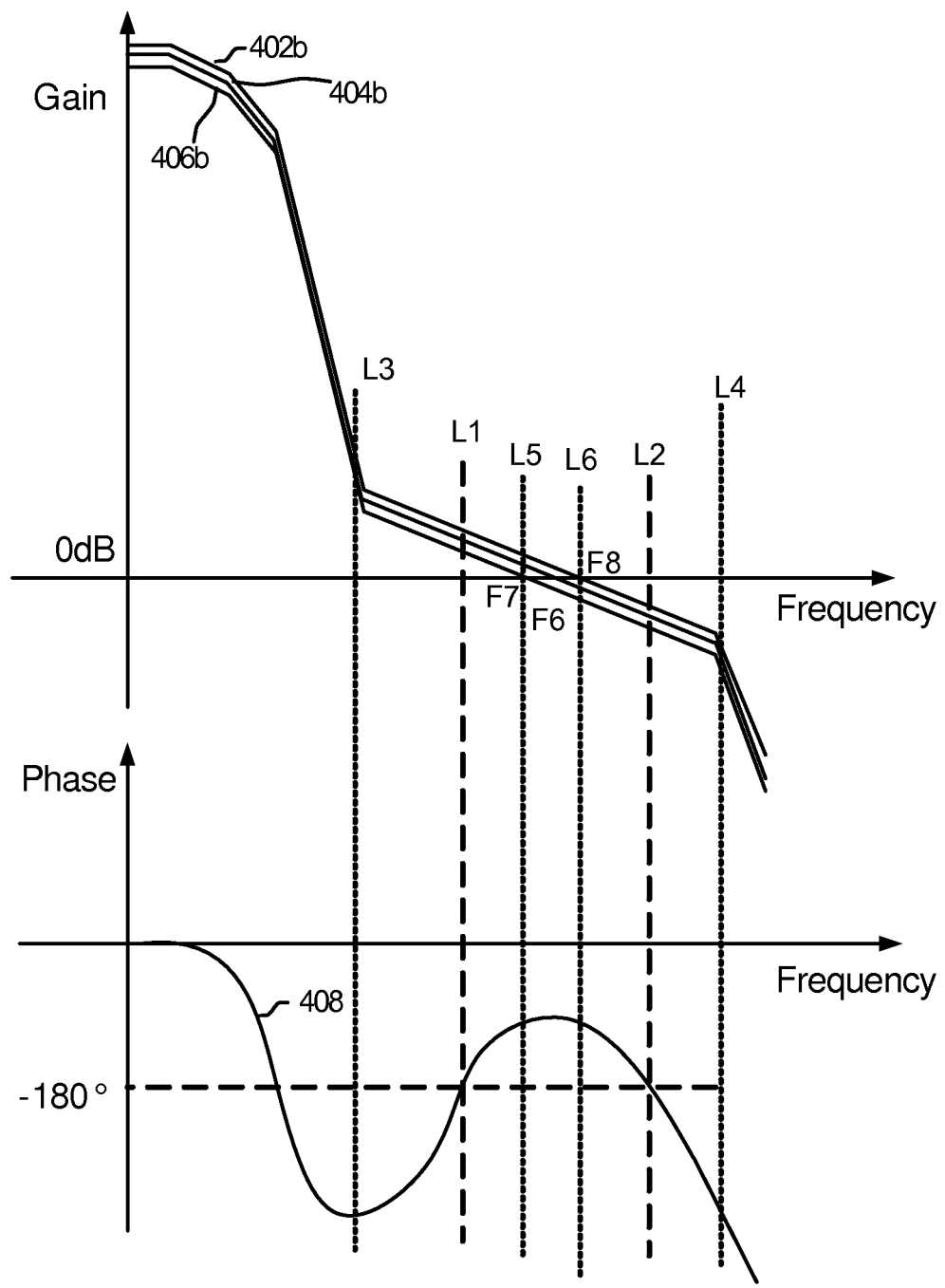
FIG. 4B is a graph showing the gain and phase curves of a conditionally-stable operational amplifier working in stable conditions under the same very high and very low feedback factors of FIG. 4A, in accordance with an embodiment of the disclosure.

FIG. 4B is a graph showing the gain and phase curves of a conditionally-stable operational amplifier working in stable conditions under the same very high and very low feedback factors of FIG. 4A, in accordance with an embodiment of the disclosure. Referring to FIG. 4B, the conditionally-stable operational amplifier may use one or more tunable wideband buffers to shift the gain curves 402a and 406a, without changing their feedback factors and while maintaining the same phase.

More specifically, one or more tunable wideband buffers may be used to shift the gain curve 406a upwards (e.g., increase the gain) so that it now intersects the 0 dB frequency axis at point F7 in FIG. 4B (rather than point F4 in FIG. 4A). Similarly, the one or more tunable wideband buffers may be used to shift the gain curve 406a downwards (e.g., decrease the gain) so that it now intersects the 0 dB frequency axis at point F8 in FIG. 4B (rather than point F5 in FIG. 4A). In this regard, the feedback factor may still vary between a very high feedback factor value (gain curve 402a) and a very low feedback factor value (gain curve 406a), but now the corresponding phase values will range between axes L5 and L6 (rather than between axes L3 and L4, as illustrated in FIG. 4A). Since all phase values along the phase curve 408 that are between axes L5-L6 are greater than −180 degrees (and are all in fact very close to the optimal phase value Pmax), the conditionally-stable operational amplifier using tunable wideband buffers now operates under stable conditions using very high to very low feedback factor range. The one or more tunable wideband buffers used within the conditionally-stable operational amplifier may be tuned by using, for example, a look-up table, so that the gain curves (for use with very high or very low feedback factors) are shifted accordingly to result in stable amplifier operation (namely, with the phase at 0 dB frequency being greater than −180 degrees).

Figure 5:
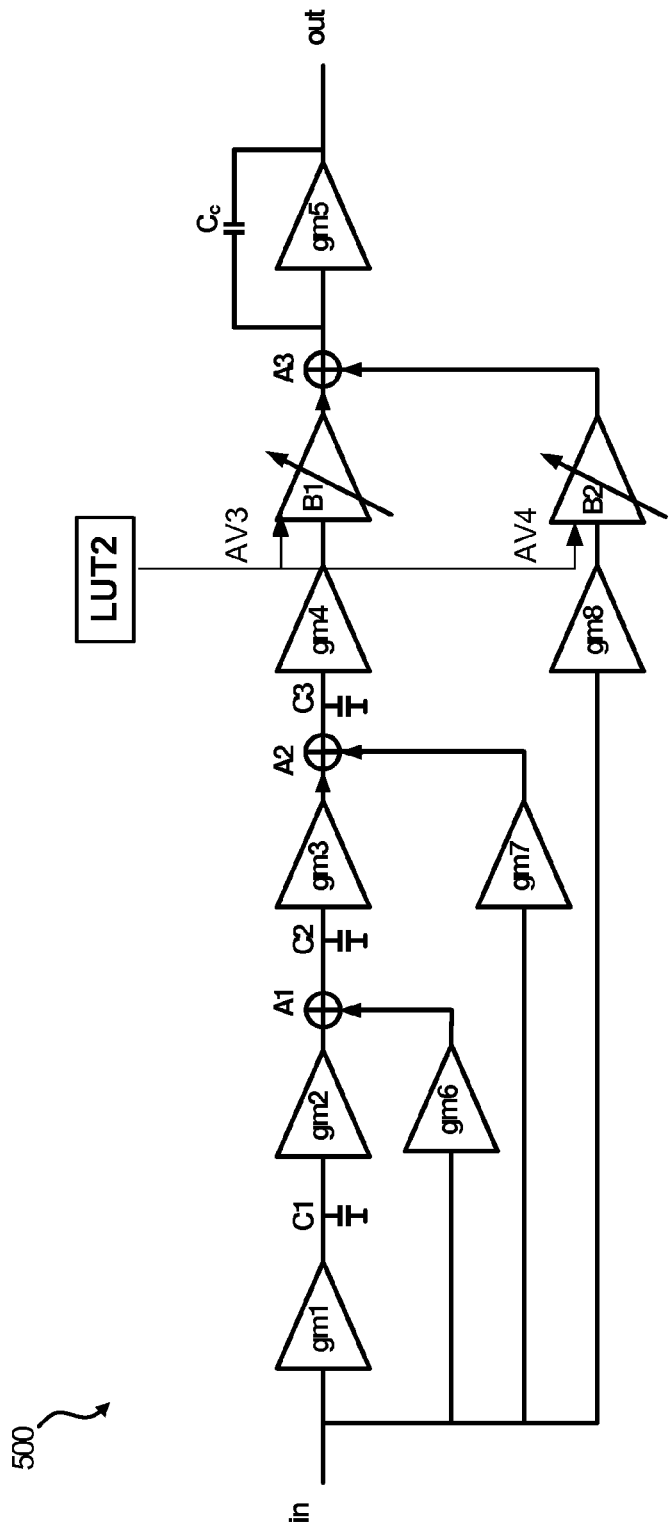
FIG. 5 is a schematic block diagram of another conditionally-stable operational amplifier with tunable wideband buffers, in accordance with an embodiment of the disclosure.

FIG. 5 is a schematic block diagram of another conditionally-stable operational amplifier with tunable wideband buffers, in accordance with an embodiment of the disclosure. Referring to FIG. 5, the conditionally-stable operational amplifier 500 may comprise transconductance modules gm1-gm8, and capacitors C1, C2, C3, and Cc. The conditionally-stable operational amplifier 500 may also comprise adders A1-A3, and tunable wideband buffers B1-B2.

The transconductance modules gm1-gm8 may comprise suitable circuitry, logic and/or code and may be operable to convert voltage into current. In an example operation cycle within the conditionally-stable operational amplifier 500, an input signal (in) may be communicated to transconductance modules gm1, gm6, gm7, and gm8. The output of transconductance module gm1 may be communicated to capacitor C1 and then to transconductance module gm2. The outputs of transconductance modules gm2 and gm6 may be added by adder A1, and then the added signal may be communicated to capacitor C2 and transconductance module gm3.

The outputs of transconductance modules gm3 and gm7 may be added by adder A2, then communicated to capacitor C3 and transconductance module gm4. The outputs of transconductance modules gm4 and gm8 may be buffered by the tunable wideband buffers B1 and B2, respectively. The output of the tunable wideband buffers B1 and B2 may be added by adder A3 and then communicated to transconductance module gm5, which is coupled in series with capacitor Cc. The output of transconductance module gm5 may be communicated as the final output signal (out).

During operation, the wideband buffers B1 and B2 may be tuned and then used to buffer one or more signals so that the gain curve of the conditionally-stable operational amplifier 500 may be shifted, but without shifting the corresponding phase. More specifically, the conditionally-stable operational amplifier 500 may also comprise a look-up table (LUT2), which may be used to provide adjustment values (AV3 and AV4) to the tunable wideband buffers B1 and B2, respectively. The adjustment values AV3 and AV4 may be used by the wideband buffers B1 and B2 for tuning the amplifier gain, if the feedback factor value is too high (or too low), with a corresponding phase at 0 dB frequency that is lower than −180 degrees.

If a desired feedback factor is initially known, then the corresponding desired gain curve may be determined based on the desired feedback factor. The gain curve may be determined by using the LUT2, for example.

Knowing the desired gain curve and the desired feedback factor, a phase may be determined corresponding to the desired gain curve at 0 dB frequency. If the phase is greater than −180 degrees, then the conditionally-stable operational amplifier is operating under stable conditions and no buffer adjustment is needed.

However, if the determined phase is smaller than −180 degrees (e.g., for gain curves 402a and 406a in FIG. 4A), then it may be concluded that the conditionally-stable operational amplifier 500 is operating under unstable conditions. The look-up table LUT2 may then be used to provide adjustment values AV3 and AV4 based on the desired gain curve, desired feedback factor and/or the determined phase. More specifically, the adjustment values AV3 and AV4 may be used to tune the buffers B1 and B2 so that when the desired gain curve and the desired feedback factor are used, the buffering will shift the gain of the amplifier up or down so that the phase corresponding to the desired gain curve at 0 dB frequency is greater than −180 degrees.

Figure 6:
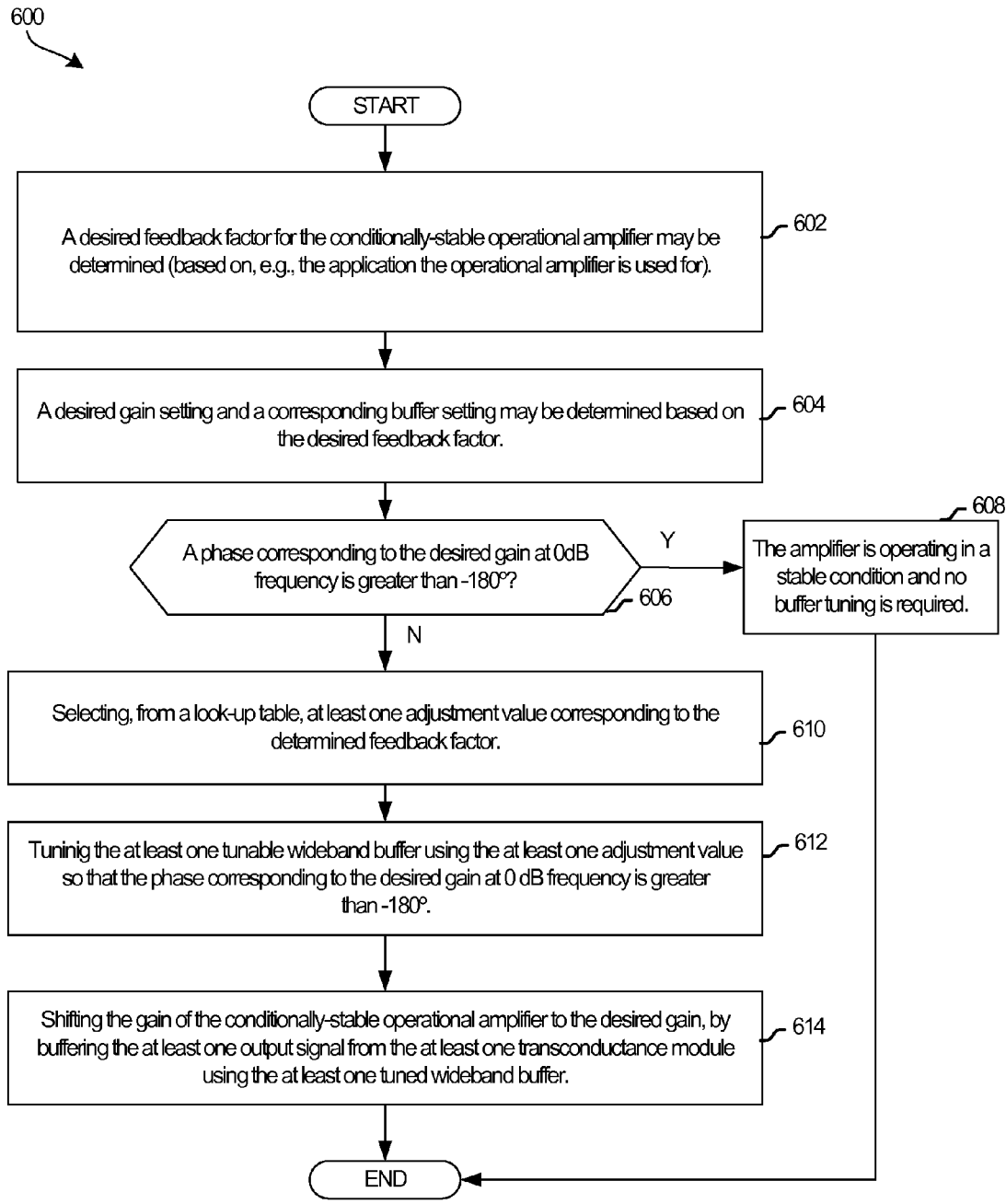
FIG. 6 is a flow chart illustrating example steps of a method for processing signals, in accordance with an embodiment of the disclosure.

FIG. 6 is a flow chart illustrating example steps of a method for processing signals, in accordance with an embodiment of the disclosure. Referring to FIGS. 4B-6, at 602, a desired feedback factor for the conditionally-stable operational amplifier 500 may be determined (based on, e.g., the application the operational amplifier is used for). At 604, a desired gain curve setting and a corresponding buffer setting may be determined based on the desired feedback factor.

The conditionally-stable operational amplifier 500 may use at least one transconductance module (e.g., gm1-gm8) coupled to at least one tunable wideband buffer (e.g., B1-B2), and is operable to shift the gain curve to the desired position, by buffering at least one output signal from the at least one transconductance module using the at least one tuned wideband buffer tuned to the determined buffer setting. For example, the desired gain curve may be represented by gain curve 402a (a very high feedback factor) or gain curve 406b (a very low feedback factor).

At 606, it may be determined whether a phase corresponding to the desired gain curve at 0 dB frequency is greater than −180°? If the phase corresponding to the desired gain curve at 0 dB frequency is greater than −180°, at 608, it may be concluded that the conditionally-stable operational amplifier is operating in a stable condition (e.g., the amplifier is stable when using gain curve 404b).

If the phase corresponding to the desired gain curve at 0 dB frequency is not greater than −180°, at 610, at least one adjustment value corresponding to the determined feedback factor (e.g., adjustment values AV3-AV4) may be selected from a look-up table (e.g., LUT2). At 612, the at least one tunable wideband buffer (e.g., B1-B2) may be tuned using the at least one adjustment value (AV3-AV4) so that the phase corresponding to the desired gain curve at 0 dB frequency is greater than −180° (as seen in FIG. 4B, compensated gain curves 402b and 406b still have very high and very low feedback factors, but the amplifier is operating in a stable condition due to the compensation/buffering provided by the tunable wideband buffers B1-B2). At 614, the gain of the conditionally-stable operational amplifier may be shifted to the desired gain, by buffering the at least one output signal from the at least one transconductance module (gm1-gm8) using the at least one tuned wideband buffer (B1-B2).

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for processing signals.

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A method for processing signals, the method comprising:
    in a conditionally-stable operational amplifier:
    shifting a gain curve of the conditionally-stable operational amplifier to a desired position, by buffering at least one output signal from at least one transconductance module within the conditionally-stable operational amplifier using a buffer, wherein:
        the desired position of the gain curve is associated with a desired feedback factor; and
        the shifting of the gain curve takes place without shifting a corresponding phase curve;
    tuning the buffer for the buffering based on the desired position of the gain curve associated with the desired feedback factor.

2. The method according to claim 1, wherein a phase at 0 dB frequency corresponding to the desired gain position of the gain curve is greater than a threshold phase.

3. The method according to claim 2, comprising:
    tuning the buffer using at least one tunable wideband buffer so that the corresponding phase at 0 dB frequency remains higher than the threshold phase.

4. The method according to claim 2, wherein the threshold phase is −180°.

5. The method according to claim 1, comprising:
    tuning the buffer so that the gain curve of the conditionally-stable operational amplifier corresponds to an optimal phase value at 0 dB frequency.

6. The method according to claim 2, comprising:
    determining the desired position of the gain curve for the conditionally-stable operational amplifier, based on the desired feedback factor.

7. The method according to claim 6, comprising:
    selecting, from a look-up table, at least one buffer adjustment value corresponding to the desired feedback factor, if a phase corresponding to the desired position of the gain curve at 0 dB frequency is smaller than −180°.

8. The method according to claim 7, comprising:
    tuning the buffer using the at least one buffer adjustment value so that the phase corresponding to the desired position of the gain curve at 0 dB frequency is greater than −180°.

9. A system for processing signals, the system comprising:
    one or more circuits comprising in a conditionally-stable operational amplifier, the one or more circuits being operable to:
        shift a gain curve of the conditionally-stable operational amplifier to a desired position, by buffering at least one output signal from at least one transconductance module within the conditionally-stable operational amplifier using a buffer, wherein:
            the desired position of the gain curve is associated with a desired feedback factor; and
            the shifting of the gain curve takes place without shifting a corresponding phase curve;
        tune the buffer for the buffering based on the desired position of the gain curve associated with the desired feedback factor.

10. The system according to claim 9, wherein a phase at 0 dB frequency corresponding to the desired position of the gain curve is greater than a threshold phase.

11. The system according to claim 10, wherein the one or more circuits are operable to:

tune the buffer using at least one tunable wideband buffer so that the corresponding phase at 0 dB frequency remains higher than the threshold phase.

12. The system according to claim 10, wherein the threshold phase is −180°.

13. The system according to claim 9, wherein the one or more circuits are operable to:
tune the buffer so that the gain curve of the conditionally-stable operational amplifier corresponds to an optimal phase value at 0 dB frequency.

14. The system according to claim 10, wherein the one or more circuits are operable to:
determine the desired position of the gain curve for the conditionally-stable operational amplifier, based on the desired feedback factor.

15. The system according to claim 14, wherein the one or more circuits are operable to:
select, from a look-up table, at least one buffer adjustment value corresponding to the desired feedback factor, if a phase corresponding to the desired position of the gain curve at 0 dB frequency is smaller than −180°.

16. The system according to claim 15, wherein the one or more circuits are operable to:
tune the buffering using the at least one buffer adjustment value so that the phase corresponding to the desired position of the gain curve at 0 dB frequency is greater than −180°.

17. A system for processing signals, the system comprising:
a conditionally-stable operational amplifier comprising at least one transconductance module coupled to at least one tunable wideband buffer, the conditionally-stable operational amplifier being operable to:
shift a gain curve of the conditionally-stable operational amplifier to a desired position, by buffering at least one output signal from the at least one transconductance module within the conditionally-stable operational amplifier using the at least one tunable wideband buffer, wherein:
the desired position of the gain curve is associated with a desired feedback factor; and
the shifting of the gain curve takes place without shifting a corresponding phase curve;
tune the at least one tunable wideband buffer for the buffering based on the desired position of the gain curve associated with the desired feedback factor.

18. The system according to claim 17, wherein the conditionally-stable operational amplifier is operable to:
select, from a look-up table, at least one buffer adjustment value corresponding to the desired feedback factor, if a phase corresponding to the desired position of the gain curve at 0 dB frequency is smaller than −180°.

19. The system according to claim 18, wherein the conditionally-stable operational amplifier is operable to:
tune the at least one tunable wideband buffer using the at least one buffer adjustment value, so that the phase corresponding to the desired position of the gain curve at 0 dB frequency is greater than −180°.

20. The system according to claim 17, wherein the conditionally-stable operational amplifier is operable to:
tune the at least one tunable wideband buffer so that the gain curve of the conditionally-stable operational amplifier corresponds to an optimal phase value at 0 dB frequency.

* * * * *